(12) United States Patent
Oksengendler et al.

(10) Patent No.: US 10,184,643 B2
(45) Date of Patent: Jan. 22, 2019

(54) ENCLOSURE WITH GROMMETLESS STRAIN RELIEF

(71) Applicant: OSRAM SYLVANIA Inc., Wilmington, MA (US)

(72) Inventors: Alex Oksengendler, Buffalo Grove, IL (US); Glenn Freeman, San Antonio, TX (US); Andrew Wilson, Brighton, MA (US); Robert Wilson, Manchester, MA (US)

(73) Assignee: OSRAM SYLVANIA Inc., Wilmington, MA (US)

( * ) Notice: Subject to any disclaimer, the term of this patent is extended or adjusted under 35 U.S.C. 154(b) by 0 days.

(21) Appl. No.: 15/608,989

(22) Filed: May 30, 2017

(65) Prior Publication Data

US 2017/0261184 A1 Sep. 14, 2017

Related U.S. Application Data

(63) Continuation of application No. 15/250,903, filed on Aug. 29, 2016, now abandoned, which is a
(Continued)

(51) Int. Cl.
*F21V 15/02* (2006.01)
*H05K 5/02* (2006.01)
(Continued)

(52) U.S. Cl.
CPC .............. *F21V 15/02* (2013.01); *F21V 15/01* (2013.01); *F21V 15/012* (2013.01);
(Continued)

(58) Field of Classification Search
None
See application file for complete search history.

(56) References Cited

U.S. PATENT DOCUMENTS 2,511,524 A * 6/1950 Adler ................... H03H 7/485
174/60
3,665,094 A * 5/1972 Matthews .......... H01H 85/2045
174/659
(Continued)

FOREIGN PATENT DOCUMENTS

DE 43 04 385 A1 8/1994
DE 20 2009 000236 U1 6/2010

OTHER PUBLICATIONS

Alain Rieutort, International Search Report and Written Opinion of the International Searching Authority for PCT/US14/64958, pp. 1-10, Feb. 19, 2015, European Patent Office, Rijswijk, The Netherlands.

*Primary Examiner* — Xanthia C Cunningham
(74) *Attorney, Agent, or Firm* — Shaun P. Montana

(57) ABSTRACT

Enclosures with grommetless strain relief are provided, each including a base and a cover. The base has a bottom and four sidewalls arranged to provide an open box-like structure. A first of the sidewalls of the base is configured with a wire routing slot at its perimeter. The cover has a top and four sidewalls arranged to provide an open box-like structure configured to couple with the base, so as to provide a strain relief for an electrical wire passing through the wire routing slot. The wire is pressed against a length of the first sidewall of the base by a first sidewall of the cover. The enclosure may include other features, such as rounded edges in the wire routing path, a wire guide and/or strap to inhibit wire movement between the first sidewalls, and/or one or more locking mechanisms configured to secure the cover to the base.

17 Claims, 7 Drawing Sheets

Related U.S. Application Data continuation of application No. 14/081,785, filed on Nov. 15, 2013, now abandoned.

(51) Int. Cl.

| | | |
|---|---|---|
| *H02G 3/06* | (2006.01) | |
| *H02G 3/08* | (2006.01) | |
| *F21V 15/01* | (2006.01) | |
| *H05K 5/03* | (2006.01) | |
| *F21V 17/16* | (2006.01) | |
| *F21V 23/00* | (2015.01) | |
| *H05K 5/04* | (2006.01) | |

(52) U.S. Cl.
 CPC .......... *F21V 17/166* (2013.01); *F21V 23/001* (2013.01); *H02G 3/0633* (2013.01); *H02G 3/083* (2013.01); *H05K 5/0217* (2013.01); *H05K 5/0221* (2013.01); *H05K 5/0247* (2013.01); *H05K 5/03* (2013.01); *H05K 5/04* (2013.01); *H02G 3/0625* (2013.01); *H02G 3/081* (2013.01)

(56) References Cited

U.S. PATENT DOCUMENTS

| | | | | |
|---|---|---|---|---|
| 3,751,579 | A * | 8/1973 | Nojiri | H02G 3/0633 174/153 G |
| 4,178,057 | A * | 12/1979 | McCormick | H02G 3/0633 174/135 |
| 4,209,661 | A * | 6/1980 | Pate | H02G 3/065 174/659 |
| 4,533,201 | A * | 8/1985 | Wasserlein, Jr. | H01R 4/2429 439/391 |
| 5,306,870 | A * | 4/1994 | Abat | H01R 9/0506 174/659 |
| 5,471,013 | A * | 11/1995 | Marchetti | H01R 13/585 174/50 |
| 5,792,995 | A * | 8/1998 | Takeda | H02G 3/26 174/152 G |
| 6,023,549 | A * | 2/2000 | Polidori | G02B 6/4422 385/134 |
| 6,310,289 | B1 * | 10/2001 | Kuo | G06F 3/0202 174/135 |
| 6,312,046 | B1 * | 11/2001 | Sora | B60R 16/0222 174/152 G |
| 6,375,129 | B2 * | 4/2002 | Koziol | H02G 3/26 174/662 |
| 6,457,843 | B1 * | 10/2002 | Kester | F21V 33/0076 362/186 |
| 6,660,937 | B1 * | 12/2003 | MacLeod | B60R 16/0222 16/2.2 |
| 6,730,849 | B2 * | 5/2004 | Koessler | H02G 15/013 174/650 |
| 7,015,394 | B2 * | 3/2006 | Desard | H02G 15/013 174/100 |
| 7,037,139 | B1 * | 5/2006 | Stefaniu | H01R 4/4818 439/660 |
| 7,041,903 | B2 * | 5/2006 | Odahara | F16C 1/105 174/135 |
| 7,244,894 | B1 * | 7/2007 | Lipp | B60R 16/0222 16/2.1 |
| 7,390,979 | B1 * | 6/2008 | Johnson | H02G 3/0691 16/2.1 |
| 7,579,556 | B2 * | 8/2009 | Tapper | H02G 3/088 16/2.1 |
| 7,781,684 | B2 * | 8/2010 | Stuckmann | H02G 3/088 16/2.1 |
| 7,786,391 | B1 * | 8/2010 | Van Pelt | H02G 3/18 16/2.1 |
| 7,830,649 | B2 * | 11/2010 | Yang | F21V 23/026 361/601 |
| 8,164,008 | B2 * | 4/2012 | Maruyama | H02K 5/225 174/562 |
| 8,324,516 | B1 * | 12/2012 | Gretz | H02G 3/083 174/650 |
| 8,497,435 | B2 * | 7/2013 | Nagata | F16J 15/106 16/2.1 |
| 8,791,376 | B2 * | 7/2014 | Endt | H02G 3/22 174/151 |
| 2001/0002622 | A1 * | 6/2001 | Teunisse | H01R 4/646 174/360 |
| 2001/0020828 | A1 * | 9/2001 | Feye-Hohmann | F21V 23/04 315/76 |
| 2002/0051349 | A1 | 5/2002 | Serizawa et al. | |
| 2003/0094301 | A1 * | 5/2003 | Takedomi | F16L 5/10 174/659 |
| 2006/0042814 | A1 * | 3/2006 | Ball | H02G 15/013 174/650 |
| 2006/0086523 | A1 * | 4/2006 | Tran | H04N 5/65 174/650 |
| 2007/0007038 | A1 * | 1/2007 | Cox | H02G 3/088 174/650 |
| 2007/0246613 | A1 * | 10/2007 | Kennedy | H02G 3/32 248/56 |
| 2008/0149385 | A1 | 6/2008 | Kanamaru | |
| 2008/0236888 | A1 * | 10/2008 | Fujikawa | H02G 11/00 174/659 |
| 2009/0166084 | A1 * | 7/2009 | Mirebeau | H01R 4/68 174/650 |
| 2011/0000712 | A1 * | 1/2011 | Kasuga | H02G 3/088 174/650 |
| 2011/0017508 | A1 * | 1/2011 | Baudelocque | F16C 32/047 174/650 |
| 2011/0100708 | A1 * | 5/2011 | Lamprecht | B25F 5/00 174/650 |
| 2011/0155455 | A1 * | 6/2011 | Chou | H05K 5/0247 174/560 |
| 2011/0308832 | A1 * | 12/2011 | Merritt | H02G 3/083 174/50 |
| 2013/0180777 | A1 | 7/2013 | Shibata et al. | |
| 2014/0049983 | A1 * | 2/2014 | Nichol | G02B 6/0018 362/610 |

\* cited by examiner

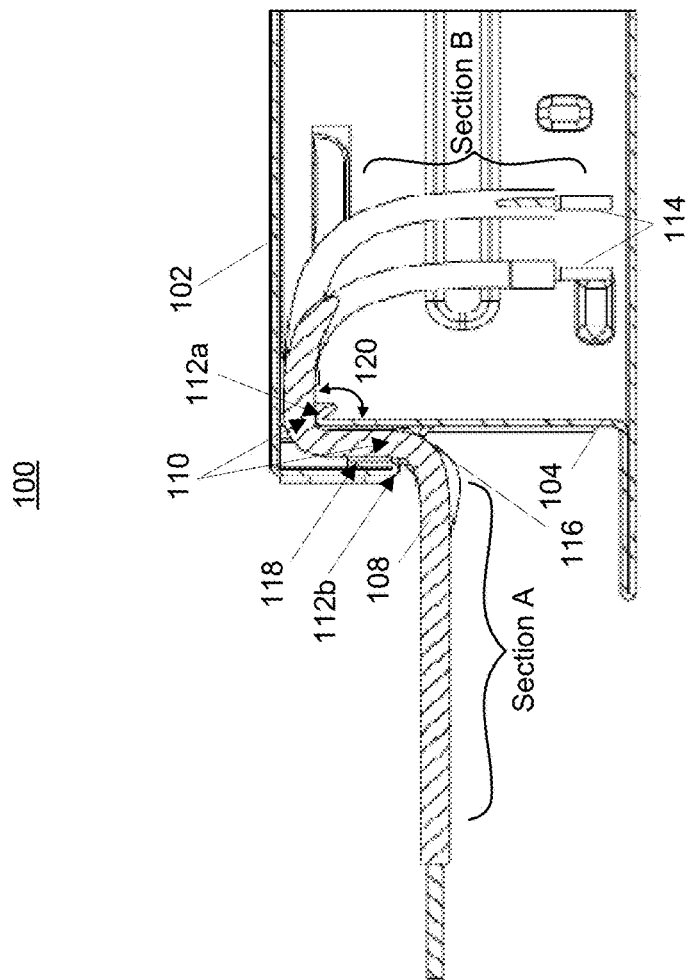
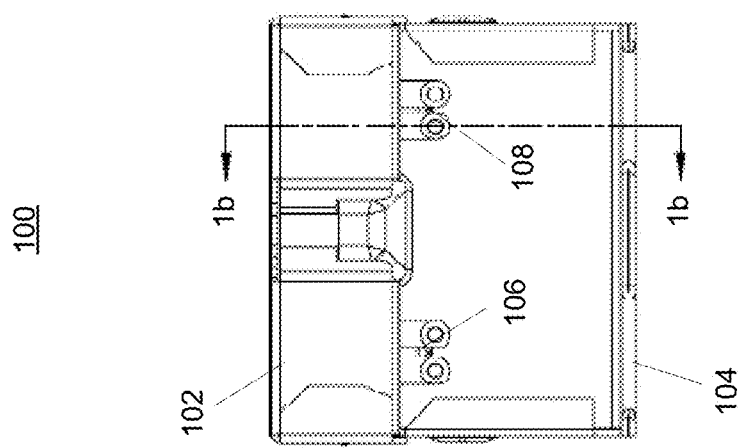
FIG. 1B
FIG. 1A

ENCLOSURE WITH GROMMETLESS STRAIN RELIEF

CROSS-REFERENCE TO RELATED APPLICATION

The present application is a continuation of, and claims priority to, U.S. patent application Ser. No. 15/250,903, filed Aug. 29, 2016, which is a continuation of, and claims priority to, U.S. patent application Ser. No. 14/081,785, filed Nov. 15, 2013, the entire contents of both of which are hereby incorporated by reference.

TECHNICAL FIELD

The present invention relates to enclosures for electronics, and more specifically, to enclosures for electronics including one or more strain reliefs.

BACKGROUND

Most commercial electronic devices that are configured with power cords and wires are generally required to have strain relief on the power cable/wires so as to comply with applicable industry standards. For instance, in the lighting industry, all ballast manufacturers have to comply with certain UL standards that necessitate the need for input and output wire protection to safeguard against electrical shock hazards and to prevent catastrophic damage to the printed circuit board (PCB) and wire-to-PCB attachment interface (solder joint). Historically, the industry has depended on the utilization of a grommet (or plastic bushing) deployed in a slot of the enclosure and around the wires to hold, protect and provide a standard-compliant interface to that enclosure. In addition, UL standards further dictate that adequate strain relief requires the grommet to clamp the cord/wires.

SUMMARY

As previously noted, clamp-type grommets are commonly used to provide standards-compliant strain relief for power cords and wiring that interface with the electronics within a given enclosure. Although such grommet-based solutions are adequate, they have a number of drawbacks. For example, grommets generally involve a cumbersome assembly process and the use of adhesives to prevent wire slippage. In addition, the use of grommets and adhesives effectively increases manufacturing costs and complexity (e.g., the grommet must be installed and the adhesives must be selectively applied to the correct areas and allowed to dry).

Thus, and in accordance with an embodiment of the present invention, grommetless strain relief techniques are provided herein. The techniques may be implemented by configuring the housing structure of the given electronic device in such a way so as to prevent the wires interfaced therewith from being pulled or pushed once installed, thereby providing compliance with many of the existing strain relief standards, such as those promulgated by Underwriter Laboratories, commonly referred to as UL standards. In one example embodiment, the housing structure generally resembles a shoe box like structure having a base portion and a cover portion, wherein once the cover is installed on the base, sidewalls of the cover portion run in parallel and proximate to sidewalls of the base portion. The base portion includes a notch or cut-out area at the top part of a given sidewall to provide a slot for snug wire routing. This routing slot can be elongated to accommodate any number of wires in a single layer. Note that the terms 'wire' or 'cable' as used herein refers to one or more conductors surrounded by insulation. In cases where multiple conductors are deployed in a single outer casing, there individual conductors within the casing may be individually surrounded by insulation, so as to prevent shorting between those individual conductors. In any such cases, during the assembly process, the wires can be routed through the routing slot and folded downward so that they are generally parallel with the base sidewall on both sides of that sidewall.

The cover can then be installed onto the base portion, so as to snugly secure the wires between the inner sidewall of the cover and the outer sidewall of the base. With the cover fully seated and secured in place on the base, the exposed wires can then be bent outward so as to be generally perpendicular to the base sidewall. As will be appreciated in light of this disclosure, the length of wire running parallel to the base sidewall can vary depending on the length of the cover sidewall. In some example embodiments, this distance ranges from 5 mm to 5 cm. With the cover securely installed over the base, the routing profile of the wires includes at least one bend which in conjunction with the wire clamping/holding effect of the housing assembly precludes the transfer of any pulling or pushing motion on the wires extending from the housing sidewall from propagating into the enclosure, thereby preventing damage to the wire connections associated with the wires (such as solder joints and/or insulation displacement contacts provisioned on PCB within enclosure).

In some example embodiments, the base and cover housing configuration may be implemented with one or more locking mechanisms, such as one or more snap-fit arrangements having male and female counterparts disposed on the base and cover sidewalls. In some such cases, the locking mechanisms may include spring-tabs that can be pushed-in or otherwise manipulated to disengage one element from the other, so that the cover can be separated from the base if so desired. As will be further appreciated in light of this disclosure, numerous strain reliefs as provided herein can be provided on any one housing. The housing may be for any electronic device. In one example embodiment, the electronic device is a lighting system component, such as a power supply, driver, ballast, or so-called electronic control gear for lighting applications.

Numerous other housing features will be apparent in light of this disclosure. For instance, in some embodiments, the base sidewall configured with the wire routing slot further includes a number of raised vertical ridges configured to provide wire routing guides on the outer base sidewall. Alternatively, or in addition to, a horizontal wire strap may be provisioned on the outer base sidewall, such that the wires can be snugly routed through the strap. In other such embodiments, the horizontal wire strap may be provisioned on the inner sidewall of the cover (rather than the outer sidewall of the base) and configured so that the wires or cable are snugly pushed against the sidewall of the base by the outer surface of the strap (rather than have the wires fit snugly through the strap). In any such cases, the interfacing surfaces between the cover and base can be shaped or otherwise configured to snugly accommodate the wires and/or strap protrusion, so as to inhibit wire movement along the base sidewall. For example, the strain relief configured in accordance with some embodiments is capable of withstanding at least five pounds of force, in accordance with various UL standards. An example of one specific standard is UL-8750, titled "Safety Standard for Light Emitting Diode (LED) Equipment for Use in Lighting Products" (e.g., see section 8.8—Cord strain and pushback relief test). In still other example embodiments, the strain relief is capable of withstanding at least 7.5 pounds of force, or at least 10 pounds of force, or at least 12.5 pounds of force, or at least 15 pounds of force. In any such cases, the force can be applied for a given duration, such as for 1 minute, or 2 minutes, . . . , or 5 minutes, etc. Also, in some embodiments, the process for forming the routing slots through which the wires are routed can be executed so that a portion of the sidewall is curled back or otherwise folded over to make a notch having a rounded lip along its edge over which the wire routing path can pass. Further note that the lip can have a thickness that effectively prevents the bend radius of the wires from exceeding a certain threshold. For instance, in some embodiments, the minimum bend radius can be limited to 90°, while in other embodiments the minimum bend radius can be limited to 85°, or 80°, or to 75°, or to 70°, . . . or to 25°. Other embodiments may be unconcerned with such a bend radius, and have no limitations thereon.

Thus, the disclosed techniques include utilization of the enclosure housing construction to secure and form cables and wires in such a way that it is impossible to transfer any adverse forces to wire-to-PCB solder joints and/or other electronic connections within the enclosure, thus preventing premature failure and/or dangerous conditions. As will be further appreciated, the disclosed techniques can provide a substantial cost savings by not requiring additional grommet-based components, adhesives, potting and the associated labor.

In an embodiment, there is provided an enclosure. The enclosure includes: a base having a bottom, a first sidewall, a second sidewall, a third sidewall, and a fourth sidewall, arranged to provide a first open box-like structure, wherein the first sidewall is configured with a wire routing slot at a perimeter of the first sidewall; and a cover having a top, a first sidewall, a second sidewall, a third sidewall, and a fourth sidewall, arranged to provide a second open box-like structure configured to couple with the base portion so as to provide a strain relief for an electrical wire passing through the wire routing slot, wherein the electrical wire is pressed against a length of the first sidewall of the base portion by the first sidewall of the cover portion.

In a related embodiment, the wire routing slot may be configured with a rounded edge over which the wire passes. In another related embodiment, the first sidewall of the base may further include a wire guide proximate to the wire routing slot and configured to inhibit movement of the wire between the first sidewall of the base and the first sidewall of the cover. In yet another related embodiment, the first sidewall of the base may further include a wire strap proximate to the wire routing slot and configured to inhibit movement of the wire between the first sidewall of the base and the first sidewall of the cover. In still another related embodiment, the first sidewall of the cover may further include a wire strap proximate to the wire routing slot and configured to inhibit movement of the wire between the first sidewall of the cover and the first sidewall of the base. In yet still another related embodiment, the enclosure may further include a locking mechanism configured to engagingly secure the cover to the base. In still yet another related embodiment, the cover may be composed of sheet metal and the base may be composed of sheet metal.

In another embodiment, there is provide an enclosure. The enclosure includes: a base having a bottom, a first sidewall, a second sidewall, a third sidewall, and a fourth sidewall, arranged to provide a first open box-like structure, wherein the first sidewall comprises a wire routing slot at a perimeter of the first sidewall, wherein the wire routing slot is configured with a rounded edge over which a wire passes; a cover having a top, a first sidewall, a second sidewall, a third sidewall, and a fourth sidewall, arranged to provide a second open box-like structure configured to couple with the base so as to provide a strain relief for the wire passing through the wire routing slot, wherein the wire is pressed against a length of the first sidewall of the base by the first sidewall of the cover; and a substrate secured with the base, wherein the wire is electrically coupled to the substrate.

In a related embodiment, the first sidewall of the base may further include at least one wire guide proximate to the wire routing slot and configured to inhibit movement of the wire between the first sidewall of the base and the first sidewall of the cover. In a further related embodiment the first sidewall of the base may further include at least one wire strap proximate to the wire routing slot and configured to inhibit movement of the wire between the first sidewall of the base and the first sidewall of the cover. In another further related embodiment, the first sidewall of the cover may further include at least one wire strap proximate to the wire routing slot and configured to inhibit movement of the wire between the first sidewall of the base and the first sidewall of the cover.

In another embodiment, there is provided a lighting electronics enclosure. The lighting electronics enclosure includes: a base having a bottom, a first sidewall, a second sidewall, a third sidewall, and a fourth sidewall, arranged to provide a first open box-like structure, the first sidewall configured with a wire routing slot at a perimeter of the first sidewall, wherein the wire routing slot is configured with a rounded edge over which a wire passes; a cover having a top, a first sidewall, a second sidewall, a third sidewall, and a fourth sidewall, arranged to provide a second open box-like structure configured to couple with the base so as to provide a strain relief for the wire passing through the wire routing slot, wherein the wire is pressed against a length of the first sidewall of the base by a first sidewall of the cover; a substrate secured with the base, wherein the wire is electrically coupled to the substrate via a solder joint and wherein the substrate includes electronics capable of providing power to a light source; and a locking mechanism configured to secure the cover to the base.

In a related embodiment, the first sidewall of the base may further include a wire guide proximate to the wire routing slot and configured to inhibit movement of the wire between the first sidewall of the base and the first sidewall of the cover. In a further related embodiment, the first sidewall of the base may further include a wire strap proximate to the wire routing slot and configured to inhibit movement of the wire between the first sidewall of the base and the first sidewall of the cover. In another further related embodiment, the first sidewall of the cover may further include a wire strap proximate to the wire routing slot and configured to inhibit movement of the wire along the first sidewall of the cover.

BRIEF DESCRIPTION OF THE DRAWINGS

The foregoing and other objects, features and advantages disclosed herein will be apparent from the following description of particular embodiments disclosed herein, as illustrated in the accompanying drawings in which like reference characters refer to the same parts throughout the different views. The drawings are not necessarily to scale, emphasis instead being placed upon illustrating the principles disclosed herein.

FIG. 1A illustrates a side view of an electronics housing assembly with grommetless strain relief according to embodiments disclosed herein.

FIG. 1B illustrates a cross-section view of the electronics housing assembly taken at the cross-section line 1B-1B of FIG. 1A according to embodiments disclosed herein.

DETAILED DESCRIPTION

Figure 2A:
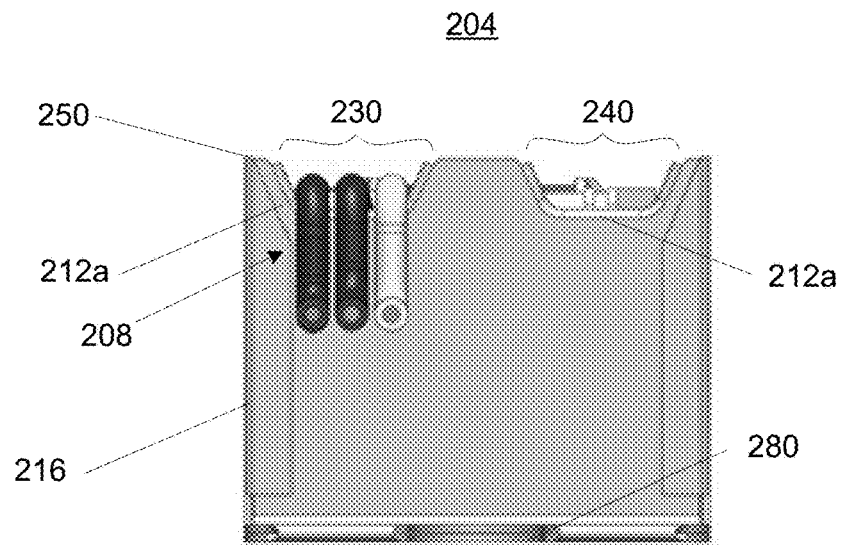
FIG. 2A illustrates a base of an electronics housing assembly with grommetless strain relief according to embodiments disclosed herein.

Embodiments provide enclosures having strain relief. In some embodiments, an enclosure includes a base and a cover. The base has a bottom and four sidewalls arranged to provide an open box-like structure, wherein a first of the sidewalls is configured with a wire routing slot at its perimeter. The cover has a top and four sidewalls arranged to provide an open box-like structure configured to couple with the base so as to provide a strain relief for an electrical wire passing through the wire routing slot. The wire is pressed against a length of the first sidewall of the base by a first of the cover sidewalls. In some embodiments, the enclosure includes other features, such as but not limited to rounded edges in a wire routing path, a wire guide and/or strap to inhibit wire movement between the first sidewalls, and/or a locking mechanism configured to secure the cover to the base.

FIG. 1A illustrates a side view of an electronics housing assembly 100 (also referred to throughout as an enclosure 100) configured with grommetless strain relief. The electronics housing assembly 100, in some embodiments, is for a lighting power supply or ballast, and in other embodiments is for one or more non-lighting related applications and/or devices. The electronics housing assembly 100 generally includes a cover 102 seated onto a base 104. As shown in FIG. 1A, a first group of wires 106 and a second group of wires 108 extend from two different spaces between the base 104 and the cover 102. As is seen with respect to FIG. 1B, which shows a cross-section view taken at a cross-section line 1b-1b of FIG. 1A, the base 104 includes a routing slot 110 configured with a rounded lip edge 112a over which the second group of wires 108 are routed. A wire routing path extends from solder joint points 114 within the base 104 (e.g., from a substrate secured within the base 104) and then passes through the routing slot 110 and down an outer sidewall 116 of the base 104. As is seen further in FIG. 1B, a wire strap 118 of the cover 102 effectively pushes the routed wires 108 snugly against the sidewall 116 of the base 104. In this way, any push-pull action on the wires 108 extending from the enclosure 100 will transfer only in a portion of the wires 108 identified in FIG. 1B as section A (i.e., on the outside of the enclosure 100) and will not be propagated to a portion of the wires 108 identified in FIG. 1B as section B (i.e., within the enclosure 100), hence providing an effective strain relief mechanism. Further note that the cover 102, in some embodiments, also includes a rounded lip edge 112b over which the wires are routed. Other implementation details are discussed throughout.

As is shown in FIG. 1B, the wire routing path, in some embodiments, is configured to provide a certain bend radius 120, if desired, such that the wire(s) 108 passing through the wire routing slot do(es) not bend more than a certain amount. To this end, either or both of the rounded lip edges 112a, 112b over which the wires 108 are routed, may be and in some embodiments are configured to encourage a bend radius 120 of a certain degree (e.g., 80° or higher) (though FIG. 1B shows the bend radius 120 for the rounded lip edge 112a only). The wider one or both of the rounded lip edges 112a, 112b are, the more gentle the bend in the wire(s) over that lip/those lips will generally be. The bend radius 120, in some embodiments, is in the range of, for example but not limited to, 25° to 80°, and in some embodiments, substantially 25° to substantially 80°. In other embodiments, the bend radius 120 is more or less than this range, according to the appropriate needs of the wire(s) passing through the wire routing slot.

In some embodiments, the length of the outer sidewall 116 of the base 104 on which one or more wires is/are pressed by the cover 102 varies. In some embodiments, this length is in the range of one to two centimeters, or substantially one to substantially two centimeters. In some embodiments, this length is 20% or more of the overall length of the outer sidewall 116 of the base 104. In still other embodiments, this length is in the range of two to five centimeters, or substantially two to substantially five centimeters. In still other embodiments, this length is in the range of five millimeters to one centimeter, or substantially five millimeters to substantially one centimeter. In general, as the length of the outer sidewall 116 decreases, the degree of clamping pressure provided on the wire(s) between the base 104 and the cover 102 may be increased, so as to ensure that the appropriate strain relief is provided. The clamping pressure may be, in some embodiments is, limited, for example, based on an established or otherwise acceptable pressure rating of the given wire(s) insulation.

The electronics housing assembly 100 may be, and in some embodiments is, implemented with any suitable materials and using any suitable manufacturing processes. In some embodiments, each of the base 104 and the cover 102 are implemented with sheet metal, and standard milling practices such as but not limited to punching, drilling, stamping, and/or cutting may be used to shape or otherwise form the base 104 and the cover 102 to have the various shapes and features shown and described throughout. For example, in some embodiments, an edge curling process may be used to provide the one or more rounded lips of the wire routing slot, whether automatically with a programmed machine (e.g., using a corresponding die and press operation) or manually (e.g., the edge is snipped and folded over using a hand tool). Seams may be soldered, spot welded, riveted, and/or press-fitted to provide a robust construction. In some embodiments, each of the base 104 and the cover 102 may be implemented with a plastic material (for example but not limited to ABS plastic or fiberglass), and may be formed with one or more injection molding processes. Subsequent machining may be used to complete feature details if needed.

FIG. 2A illustrates a side view of a base 204 of an electronics housing assembly configured with grommetless strain relief. The base 204 includes a first routing slot 230 and a second routing slot 240, each having a rounded lip 212a over which wires 208 may be routed. Other embodiments may and do include fewer or more routing slots, and any given routing slot may be configured to route one or more wires/cables, depending on the electrical connectors needed for the electronic device, as will be appreciated. The thickness of the wires 208 (including wire gauge and insulation) may be set as desired to meet the electrical requirements of the given application, but generally does not extend past an uppermost edge 250 of a sidewall 216 of the base 204. The top surface of the wire need not, however, be flush with the uppermost edge 250. In other words, there may be, and in some embodiments is, some excess space between the top of the wire(s) 208 and the top of the routing slot 230. To this end, the wires 208 may be secured in the vertical plane between the sidewall 216 of the base 204 and a corresponding sidewall of a corresponding cover 202 (not shown in FIG. 2A), and need not be secured in the horizontal plane as well. In other embodiments, the wire(s) 208 are secured in the horizontal plane as well as the vertical plane, so that there is no excess space between the top of the wire(s) and the top of the routing slot through which the wires pass (i.e., the top surface of the wire is flush with the uppermost edge of the sidewall of the base). The base 204 also includes a bottom 280.

Figure 2B:
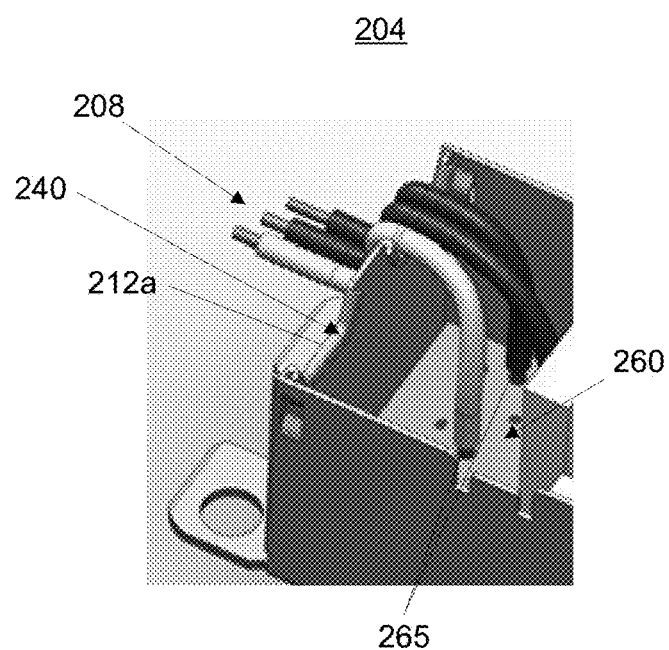
FIG. 2B illustrates a perspective downward looking view of the base of FIG. 2A according to embodiments disclosed herein.

FIG. 2B illustrates a perspective downward looking view of the base 204 shown in FIG. 2A. The base 204 in FIG. 2B includes a substrate 260, such as but not limited to a printed circuit board, disposed therein. The wires 208 are attached to the substrate 260 via solder joint connections 265. Other embodiments may include other wire attachment mechanisms such as but not limited to connectors, inserts, and so on. In some embodiments, the substrate may be located within the base 204 at a different position, such as but not limited to mid-way up the sidewalls of the base. Alternatively, in other embodiments, the substrate may be disposed in a vertical fashion on one or more of the sidewalls of the base. To this end, the portion of the wires 208 within the enclosure, of which the base 204 forms a part, need not be configured in the vertical direction as shown, but may alternatively extend horizontally through the enclosure. In still other embodiments, the internal wire routing path may include both vertical and horizontal components. In any such cases, action on the exposed wire(s) extending outside the enclosure will not be transferred or otherwise propagated to the internal sections of the wire(s).

Figure 3:
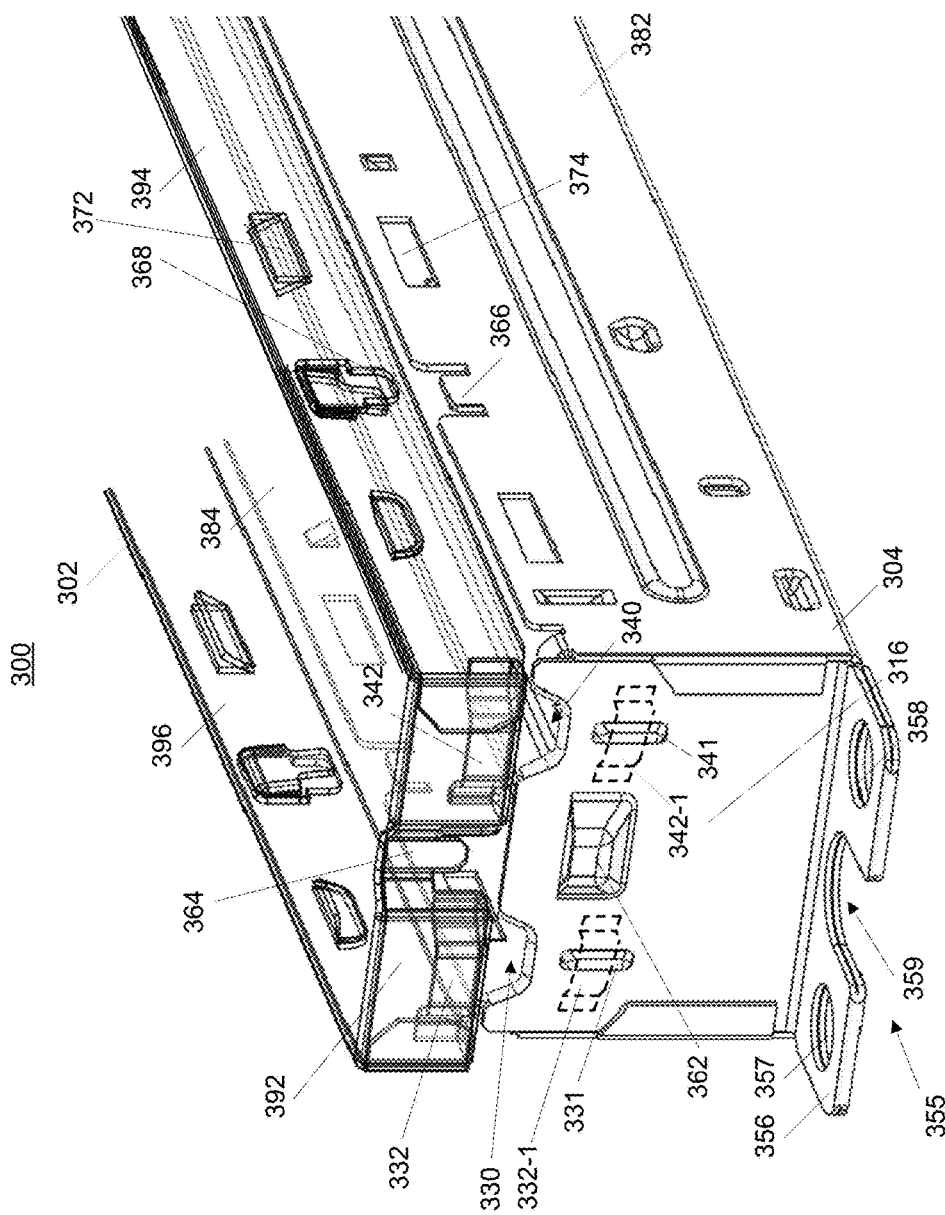
FIG. 3 illustrates an electronics housing assembly configured with a base and a cover shown separately, but configured to engage with one another to provide grommetless strain relief, according to embodiments disclosed herein.

FIG. 3 illustrates an electronics housing assembly 300 (also referred to throughout as an enclosure 300) configured with a base 304 and a cover 302 shown separately but configured to engage with one another to provide grommetless strain relief. The cover 302 is shown in a semi-transparent fashion so as to show some of the features that may be, and in some embodiments are, used. The enclosure 300 has an elongated form factor, though embodiments may have any dimension suitable for a given application, as will be appreciated. In general, the base 304 has a bottom (not shown in FIG. 3), a first sidewall 316, a second sidewall 382, a third sidewall 384 opposite the second sidewall 382, and a fourth sidewall opposite the first sidewall 316 (not shown in FIG. 3). The combination of the bottom and the four sidewalls are arranged to provide an open box-like structure for the base 304. In a similar fashion, the cover 302 has a top (not shown in FIG. 3), a first sidewall 392, a second sidewall 394, a third sidewall 396 opposite the second sidewall 394, and fourth sidewall opposite the first sidewall 392 (not shown in FIG. 3). The top and the four sidewalls of the cover 302 are arranged to provide an open box-like structure for the cover 302. The enclosure 300 shown in FIG. 3 includes sidewalls of the cover 302 that are shorter than the corresponding sidewalls of the base 304.

The base 304 is configured with mounting features 355, wherein each end of the base 304 includes a flange 356 having two holes 357, 358 and a U-shaped slot 359 for securing the base 304 to a chassis or other suitable mounting surface. Numerous other mounting schemes may be, and in some embodiments are, used. Strain relief is provided at at least one end of the enclosure 300, and includes a number of features of the base 304 and the cover 302 that collectively operate together. In addition, the cover 302 may be, and in some embodiments is, securely fastened to the base 304 by operation of a number of complementary locking features 362, 364 provisioned on the sidewalls of the base 304 and the sidewalls of the cover 302, which will be discussed in turn. Though multiple types of locking arrangements are shown in FIG. 3, not all need by employed in all embodiments.

In more detail, and with respect to the strain relief feature, the base 304 includes a first routing slot 330 and a second routing slot 340, each having a vertical wire guide 331, 341. Each routing slot 330, 340 is sized to pass one or more wires of a particular size (not shown in FIG. 3), each of which goes down the outer sidewall 316 of the base 304 and to one side of the respective vertical wire guide 331, 341. The cover 302 includes a horizontal wire strap 332, 342 for each respective routing slot 330, 340, which snugly pushes the wire(s) from each respective routing slot 330, 340 against the outer sidewall 316 of the base 304. By clamping the wires between the outer sidewall 316 of the base 304 and the respective horizontal strap 332, 342 of the cover 302, the wires are securely held in place as they generally cannot move laterally given the wire guide 331, 341 and they generally cannot move longitudinally given the shape of the wire routing slot 330, 340 and the clamping effect of the horizontal strap 332, 342. In some embodiments, one or more optional horizontal wire straps 332-1, 342-1 are alternatively provisioned on the outer sidewall 316 of the base 304, so that the wires can be snugly routed therethrough. In some embodiments, neither the cover 302 nor the base 304 includes one or more straps, so that the wires are directly and snugly sandwiched between the inner sidewall 392 of the cover 302 and the outer sidewall 316 of the base 304. In such embodiments, the vertical wire guides 331, 341 or similar raised features on the sidewall 316 of the base 304 may be used to prevent or otherwise inhibit lateral movement of the wires along the sidewall 316 of the base 304. Any edges of the electronics housing assembly 300 with which the wires come in contact may be, and in some embodiments are, curled or otherwise configured with a rounded lip to prevent the wires from becoming compromised, as previously explained with regards to FIGS. 1A and 1B.

FIG. 3 also shows a number of locking arrangements, such as but not limited to the complementary locking features 362, 364 described above. In general, each arrangement includes complementary features, with one or more on a sidewall 316, 382, 384 of the base 304 and one or more correspondingly on a sidewall 392, 394, 396 of the cover 302. For instance, the sidewall 316 of the base 304 in FIG. 3 includes a female locking feature 362 generally disposed between the first vertical wire guide 331 and the second vertical wire guide 341, and pressed outward from the sidewall 316 of the base 304 so as to provide a slot. The cover 302 is configured with the corresponding male locking feature 364, including a tab configured to be snugly inserted into the female locking feature 362 on the base 304. The electronics housing assembly 300 may also, or alternatively, include locking features along the other sidewalls of the base 304 and the cover 302. For example, another possible locking feature is a slotted locking feature 366, 368 that includes a flush tab 366 formed on the second sidewall 382 of the base 304 and configured to be received by a slot 368 of a corresponding portion pressed inward on the second sidewall 394 of the cover 302. As another example, another possible locking feature is a snap-fit locking feature 372, 374 with an angled push-tab 372 and a corresponding rectangular cut-out 374 in the second sidewall 382 of the base 304 that is configured to receive the angled push-tab 372 that is pushed inward on the second sidewall 394 of the cover 306. Note that such a snap-fit locking feature 372, 374, once operated is difficult to reverse, given that the angled push-tab 372 shown in FIG. 3 deflects into the enclosure 300. Thus, in other embodiments, the rectangular cut-out 374 is formed in the second sidewall 394 of the cover 302 and is configured to receive an angled push-tab 372 pushed outward from the second sidewall 382 of the base 304. Note that such a snap-fit locking feature, once operated, may be reversed by pushing inward on the angled push-tab 372 and lifting the cover 302 upward.

Figure 4A:
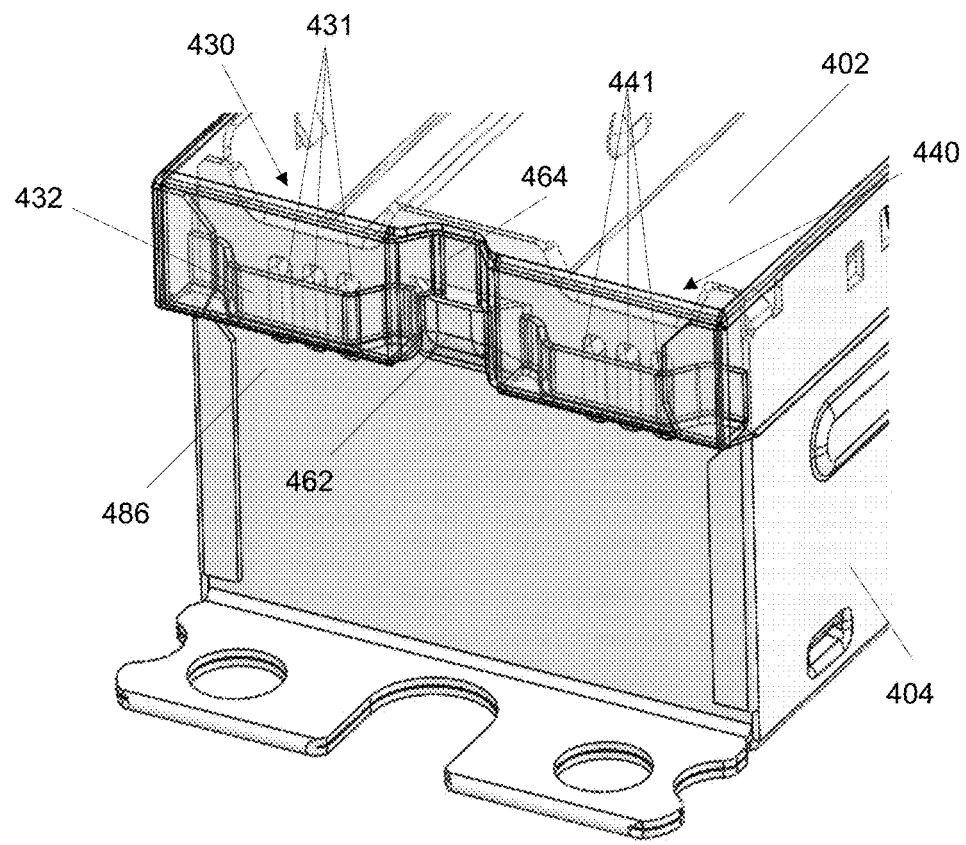
FIGS. 4A, 4B, and 4C each illustrate a perspective partially transparent view of an electronics housing assembly configured with a base and a cover shown engaged with one another to provide grommetless strain relief according to embodiments disclosed herein.
Figure 4B:
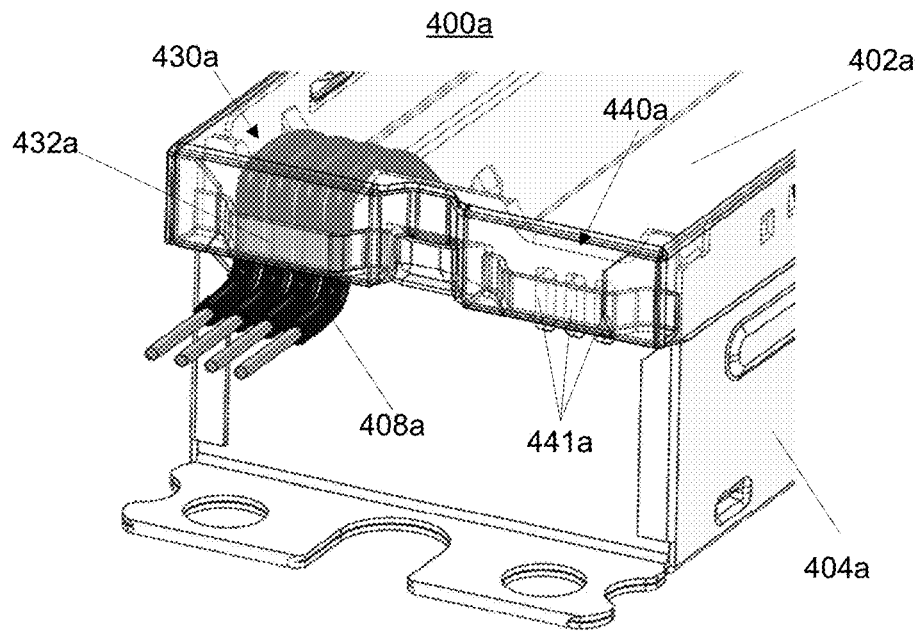
Figure 4C:
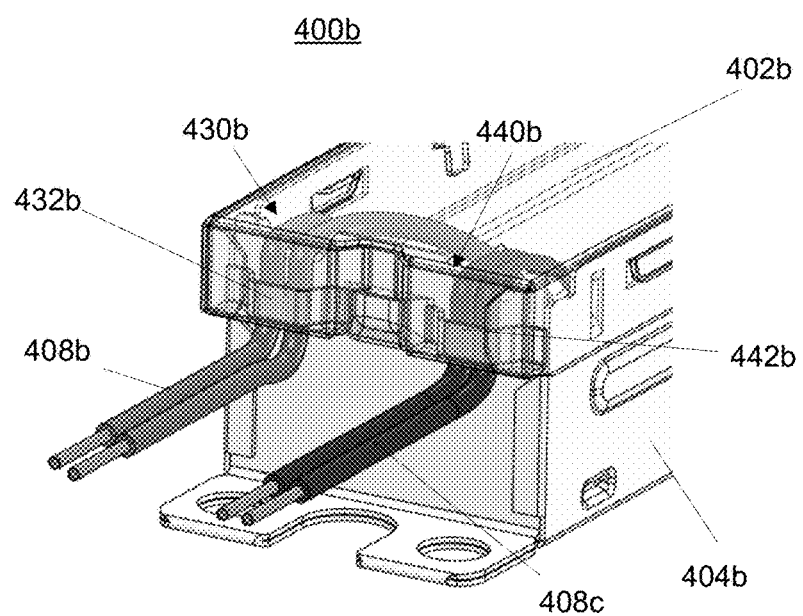

FIGS. 4A-4C each illustrate a perspective partially transparent view of an electronics housing assembly 400, 400a, 400b (also referred to throughout as an enclosure 400, 400a, 400b). In FIG. 4A, the enclosure 400 includes a cover 402 and a base 404, engaged with one another to provide at least two grommetless strain reliefs. Though no wires are shown in FIG. 4A, the base 404 includes a first set of three vertical wire guides 431 for a first routing slot 430, and a second set of three vertical wire guides 441 for a second routing slot 440. One or more wires, if present, would pass through one or more of the vertical wire guides when passing through one or more of the routing slots. The cover 402 includes at least one wire strap 432 to push against any wires passing through the first set of three vertical wire guides 431. In some embodiments, the base 404 may also include at least one wire strap, through which any wires passing through a set of vertical wires guides may be securely threaded. The cover 402 snugly fits over the base 404 to secure any wires in place. A male locking element 464, which is an outwardly angled tab in FIG. 4A, of the cover 402 engages with a female locking element 462, which is an outward slot, of the base 404. The cover 402 may be removed by pushing in on the outwardly angled tab 464 and pulling the cover 402 from the base 404. The enclosure 400 of FIG. 4A is arranged such that a fourth sidewall 486, opposite a first sidewall (not shown in FIG. 4A) includes the first routing slot 430, the second routing slot 440, and the sets of three vertical wire guides 431, 441. This is in contrast to, for example, the enclosure 300 of FIG. 3, where it is the first sidewall 316, opposite the fourth sidewall (not shown in FIG. 3) that includes such elements. Similarly, a fourth sidewall 498 of the cover 402, opposite the first sidewall of the cover (not shown in FIG. 4A), includes the at least one wire strap 432. This is in contrast to the cover 302 of FIG. 3, where it is the first sidewall 392 of the cover 302, opposite the fourth sidewall (not shown in FIG. 3), that includes the wire strap 332.

In FIG. 4B, the enclosure 400a includes a cover 402a and a base 404a, engaged with one another to provide at least two grommetless strain reliefs. Similar to the enclosure 400 of FIG. 4A, the enclosure 400a of FIG. 4B includes a first routing slot 430a and a second routing slot 440a, as well as a first set of vertical wire guides (not shown in FIG. 4B) and a second set of vertical wire guides 441a, and at least one wire strap 432a on the cover 402a. However, in contrast to the enclosure 400 of FIG. 4A, the enclosure 400a of FIG. 4B includes a cluster of four wires 408a passing through the first routing slot 430a, and through the at least one wire strap 432a, and thus through the first set of vertical wire guides, preventing the first set of vertical wire guides from being seen in FIG. 4B.

In FIG. 4C, the enclosure 400b includes a cover 402b and a base 404b, engaged with one another to provide at least two grommetless strain reliefs. Similar to the enclosure 400 of FIG. 4A and the enclosure 400a of FIG. 4B, the enclosure 400b of FIG. 4C includes a first routing slot 430b and a second routing slot 440b, as well as a first set of vertical wire guides (not shown in FIG. 4C) and a second set of vertical wire guides (also not shown in FIG. 4C). The cover 402b also includes a first wire strap 432b and a second wire strap 442b. However, in contrast to the enclosure 400 of FIG. 4A and the enclosure 400a of FIG. 4B, the enclosure 400b of FIG. 4C includes a first cluster of two wires 408b passing through the first routing slot 430b, and through the first wire strap 432b, and thus through the first set of vertical wire guides, preventing the first set of vertical wire guides from being seen in FIG. 4C. The enclosure 400b of FIG. 4C also includes a second cluster of two wires 408c passing through the second routing slot 440b, and through the second wire strap 442b, and thus through the second set of vertical wire guides, preventing the second set of vertical wire guides from being seen in FIG. 4C. Though not seen, each set of vertical wire guides in FIG. 4C includes a single vertical wire guide, due to the presence of just two wires passing through each routing slot.

Figure 5:
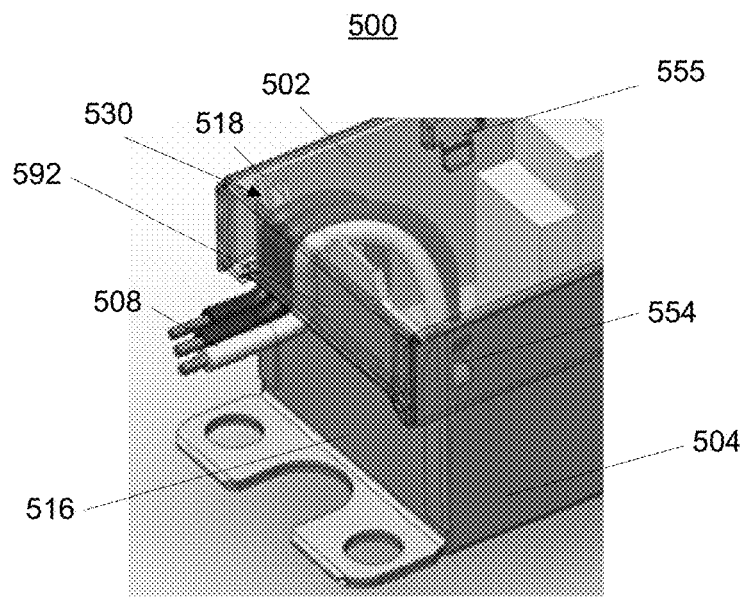
FIG. 5 illustrates a perspective partially transparent view of an electronics housing assembly configured with a locking arrangement for engaging a base and a cover to provide grommetless strain relief according to embodiments disclosed herein.

FIG. 5 illustrates a perspective partially transparent view of an electronics housing assembly 500 configured with one or more locking arrangements 554, 555 for engaging a base 504 and a cover 502 to provide grommetless strain relief for a cluster of wires 508. The strain relief is implemented by sandwiching the cluster of wires 508 between an outer sidewall 516 of the base 504 and an inner sidewall 592 of the cover 502, in combination with a routing slot 530 configured with a rounded lip edge 518. The electronics housing assembly 500 does not include any wire straps or wire guides. A combination of snap-fit locking arrangements 554 and slotted locking arrangements 555 are used to secure the cover 502 to the base 504, forming the electronics housing assembly 500.

Figure 6:
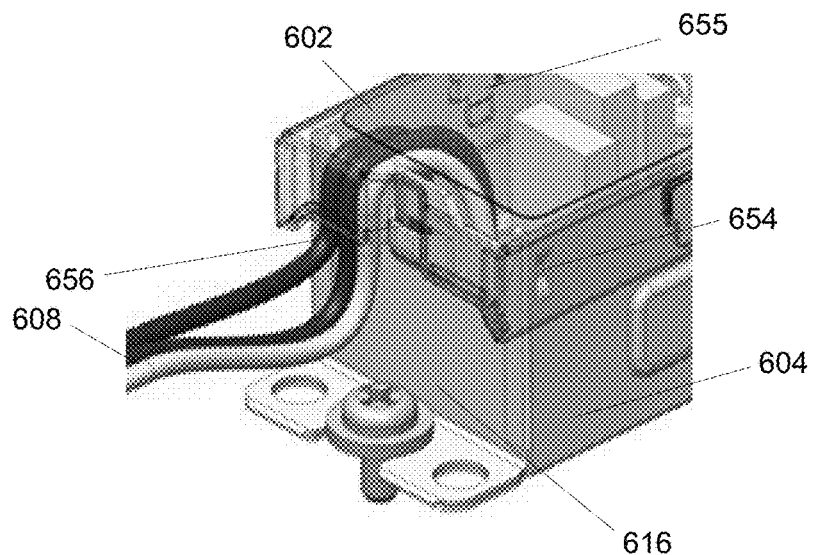
FIG. 6 illustrates a perspective partially transparent view of an electronics housing assembly configured with multiple locking arrangements for engaging a base and a cover to provide grommetless strain relief according to embodiments disclosed herein.

FIG. 6 illustrates a perspective partially transparent view of an electronics housing assembly 600 configured with a number of locking arrangements 654, 655, 656 for engaging a base 604 and a cover 602 to provide grommetless strain relief. The electronics housing assembly 600 is similar to the electronics housing assembly 500 shown in FIG. 5, except that an additional snap-fit locking arrangement 656 is deployed proximate to the strain relief, thereby inhibiting lateral movement of wires 608. In particular, the outer sidewall 616 of the base 604 includes a female locking element generally disposed proximate to the wire routing path and pressed outward from the outer sidewall 616 of the base 604 so as to provide a slot. The cover 602 is configured with a corresponding inwardly pressed male locking element including a tab configured to be snugly inserted into the female element on the base 604.

Figure 7:
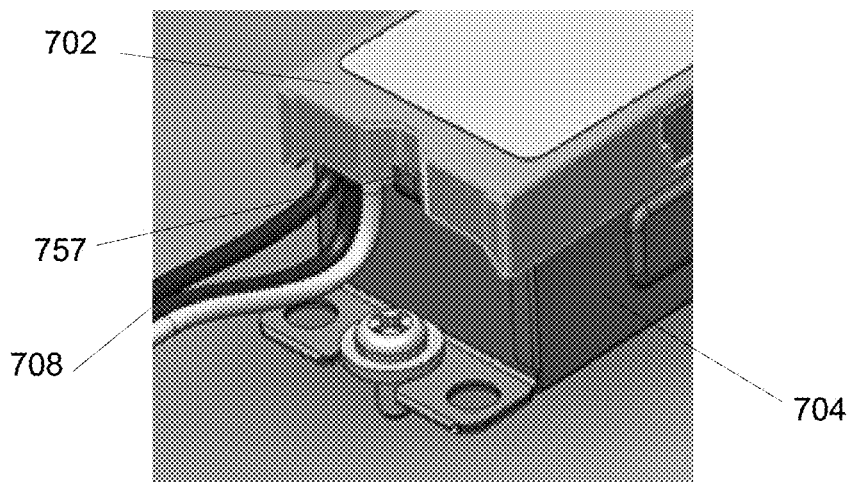
FIG. 7 illustrates a perspective partially transparent view of an electronics housing assembly configured with a locking arrangement for engaging a base and a cover to provide grommetless strain relief according to embodiments disclosed herein.

FIG. 7 illustrates a perspective partially transparent view of an electronics housing assembly 700 configured with a snap-fit locking arrangement 757 for engaging a base 704 and a cover 702 to provide grommetless strain relief for wires 708. The electronics housing assembly 700 is similar to the electronics housing assembly 600 of FIG. 6, except that the snap-fit locking arrangement 757 is proximate the strain relief and is the only locking mechanism used to secure the base 704 and the cover 702. Such an arrangement may be helpful in applications where the need to separate the cover 702 from the base 704 is frequently necessary. In some embodiments, the other end of the electronics housing assembly 700, opposite the end including the strain relief, may include a simple slot-tab arrangement that is designed to be easily pulled apart once the snap-fit locking arrangement 757 at the strain relief end is disengaged.

Unless otherwise stated, use of the word "substantially" may be construed to include a precise relationship, condition, arrangement, orientation, and/or other characteristic, and deviations thereof as understood by one of ordinary skill in the art, to the extent that such deviations do not materially affect the disclosed methods and systems.

Throughout the entirety of the present disclosure, use of the articles "a" and/or "an" and/or "the" to modify a noun may be understood to be used for convenience and to include one, or more than one, of the modified noun, unless otherwise specifically stated. The terms "comprising", "including" and "having" are intended to be inclusive and mean that there may be additional elements other than the listed elements.

Elements, components, modules, and/or parts thereof that are described and/or otherwise portrayed through the figures to communicate with, be associated with, and/or be based on, something else, may be understood to so communicate, be associated with, and or be based on in a direct and/or indirect manner, unless otherwise stipulated herein.

Although the methods and systems have been described relative to a specific embodiment thereof, they are not so limited. Obviously many modifications and variations may become apparent in light of the above teachings. Many additional changes in the details, materials, and arrangement of parts, herein described and illustrated, may be made by those skilled in the art.

What is claimed is:

1. An enclosure, comprising:
a base having a bottom, a first sidewall, a second sidewall, a third sidewall, and a fourth sidewall, arranged to provide a first open box-like structure, wherein the first sidewall is configured with a wire routing slot at a perimeter of the first sidewall; and
a cover having a top, a first sidewall, a second sidewall, a third sidewall, and a fourth sidewall, arranged to provide a second open box-like structure configured to couple with the base so as to provide a strain relief for an electrical wire passing through the wire routing slot, wherein the electrical wire is pressed against a first length of the first sidewall of the base by a second length of the first sidewall of the cover, wherein the first length overlaps the second length, and the first length and the second length are parallel.

2. The enclosure of claim 1, wherein the wire routing slot is configured with a rounded edge over which the wire passes.

3. The enclosure of claim 1, wherein the first sidewall of the base further comprises a wire guide proximate to the wire routing slot and configured to inhibit movement of the wire between the first sidewall of the base and the first sidewall of the cover.

4. The enclosure of claim 1, wherein the first sidewall of the base further comprises a wire strap proximate to the wire routing slot and configured to inhibit movement of the wire between the first sidewall of the base and the first sidewall of the cover.

5. The enclosure of claim 1, wherein the first sidewall of the cover further comprises a wire strap proximate to the wire routing slot and configured to inhibit movement of the wire between the first sidewall of the cover and the first sidewall of the base.

6. The enclosure of claim 1, further comprising a locking mechanism configured to engagingly secure the cover to the base.

7. The enclosure of claim 1, wherein the cover is composed of sheet metal and wherein the base is composed of sheet metal.

8. The enclosure of claim 1, wherein the first length of the first sidewall of the base is 20 percent or more of an overall length of the first sidewall.

9. The enclosure of claim 1, wherein the first length of the first sidewall of the base is in the range of substantially 5 millimeters to substantially 5 centimeters.

10. An enclosure, comprising:
a base having a bottom, a first sidewall, a second sidewall, a third sidewall, and a fourth sidewall, arranged to provide a first open box-like structure, wherein the first sidewall comprises a wire routing slot at a perimeter of the first sidewall, wherein the wire routing slot is configured with a rounded edge over which a wire passes;
a cover having a top, a first sidewall, a second sidewall, a third sidewall, and a fourth sidewall, arranged to provide a second open box-like structure configured to couple with the base so as to provide a strain relief for the wire passing through the wire routing slot, wherein the wire is pressed between, and extends parallel to, a planar surface of the first sidewall of the base and a planar surface of the first sidewall of the cover; and
a substrate secured with the base, wherein the wire is electrically coupled to the substrate.

11. The enclosure of claim 10, wherein the first sidewall of the base further includes at least one wire guide proximate to the wire routing slot and configured to inhibit movement of the wire between the first sidewall of the base and the first sidewall of the cover.

12. The enclosure of claim 11, wherein the first sidewall of the base further includes at least one wire strap proximate to the wire routing slot and configured to inhibit movement of the wire between the first sidewall of the base and the first sidewall of the cover.

13. The enclosure of claim 11, wherein the first sidewall of the cover further includes at least one wire strap proximate to the wire routing slot and configured to inhibit movement of the wire between the first sidewall of the base and the first sidewall of the cover.

14. A lighting electronics enclosure, comprising:
a base having a bottom, a first sidewall, a second sidewall, a third sidewall, and a fourth sidewall, arranged to provide a first open box-like structure, the first sidewall configured with a wire routing slot at a perimeter of the first sidewall, wherein the wire routing slot is configured with a rounded edge over which a wire passes;
a cover having a top, a first sidewall, a second sidewall, a third sidewall, and a fourth sidewall, arranged to provide a second open box-like structure configured to couple with the base so as to provide a strain relief for the wire passing through the wire routing slot, wherein the wire is pressed against a first length of the first sidewall of the base by a second length of the first sidewall of the cover, wherein the first length overlaps the second length and the first length and the second length are parallel;
a substrate secured with the base, wherein the wire is electrically coupled to the substrate via a solder joint and wherein the substrate includes electronics capable of providing power to a light source; and
a locking mechanism configured to secure the cover to the base.

15. The lighting electronics enclosure of claim 14, wherein the first sidewall of the base further comprises a wire guide proximate to the wire routing slot and configured to inhibit movement of the wire between the first sidewall of the base and the first sidewall of the cover.

16. The lighting electronics enclosure of claim 15, wherein the first sidewall of the base further comprises a wire strap proximate to the wire routing slot and configured to inhibit movement of the wire between the first sidewall of the base and the first sidewall of the cover.

17. The enclosure of claim 15, wherein the first sidewall of the cover further comprises a wire strap proximate to the wire routing slot and configured to inhibit movement of the wire along the first sidewall of the cover.

* * * * *